(12) United States Patent
Wang et al.

(10) Patent No.: US 10,224,879 B1
(45) Date of Patent: Mar. 5, 2019

(54) PEAK DETECTOR AND OPERATIONAL AMPLIFIER CIRCUIT THEREIN

(71) Applicant: NATIONAL SUN YAT-SEN UNIVERSITY, Kaohsiung (TW)

(72) Inventors: Chua-Chin Wang, Kaohsiung (TW); Deng-Shian Wang, Kaohsiung (TW); Hao-Chun Huang, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 15/854,135

(22) Filed: Dec. 26, 2017

(51) Int. Cl.
*H03F 1/26* (2006.01)
*H03F 3/45* (2006.01)
*H03F 3/393* (2006.01)

(52) U.S. Cl.
CPC .............. *H03F 1/26* (2013.01); *H03F 3/393* (2013.01); *H03F 3/4521* (2013.01); *H03F 3/45273* (2013.01); *H03F 2200/271* (2013.01); *H03F 2200/435* (2013.01); *H03F 2203/45138* (2013.01); *H03F 2203/45212* (2013.01); *H03F 2203/45288* (2013.01)

(58) Field of Classification Search
CPC ........................................................ H03F 1/26
See application file for complete search history.

(56) References Cited

U.S. PATENT DOCUMENTS

| | | | | |
|---|---|---|---|---|
| 5,818,620 | A * | 10/1998 | Akimoto | H04B 10/695 398/209 |
| 6,831,521 | B1 * | 12/2004 | Abidin | H03F 3/08 330/136 |
| 7,385,443 | B1 * | 6/2008 | Denison | H03F 3/38 330/10 |
| 9,559,639 | B2 * | 1/2017 | Su | H03F 1/52 |
| 9,571,043 | B1 * | 2/2017 | Lum | H03F 3/45977 |
| 2014/0232456 | A1 * | 8/2014 | Huijsing | H03F 1/56 330/9 |
| 2017/0102438 | A1 * | 4/2017 | Motz | G01R 33/0029 |
| 2017/0131327 | A1 * | 5/2017 | Ullmann | G01R 1/30 |

* cited by examiner

*Primary Examiner* — Patricia T Nguyen
(74) *Attorney, Agent, or Firm* — Jackson IPG PLLC; Demian K. Jackson

(57) ABSTRACT

A peak detector utilizes two choppers to cancel offset voltage of a transconductance amplifier, so the influence of the offset voltage is preventable and the peak detection accuracy of the peak detector can be improved significantly.

10 Claims, 3 Drawing Sheets

PEAK DETECTOR AND OPERATIONAL AMPLIFIER CIRCUIT THEREIN

FIELD OF THE INVENTION

This invention generally relates to a peak detector and an operational amplifier, and more particularly to a peak detector and an operational amplifier able to cancel offset voltage.

BACKGROUND OF THE INVENTION

A peak detector is conventionally utilized to detect an input voltage's peak, thus can be applied to biosensors to detect the peak of bio-signals for obtaining the characteristic of the bio-signals. For this reason, a peak detector with higher sensitivity and accuracy is required. The detection principle of the conventional peak detector is described as follows. An operational amplifier circuit is utilized to receive and compare the input voltage and a charge voltage of a charge capacitor in electric potential. If the input voltage is greater than the charge voltage in electric potential, a transistor is ON and allows a power source to charge the charge capacitor for increasing the electric potential of the charge voltage of the charge capacitor. On the other hand, if the input voltage is lower than the charge voltage in electric potential, the transistor is OFF to stop charging the charge capacitor, so the electric potential of the charge voltage stops increasing and that means that the input voltage reaches a peak. However, the non-ideal operational amplifier may be influenced by an offset voltage, i.e., the offset voltage may cause a peak-to-peak difference between the real input voltage and the voltage comparing with the charge voltage in the operational amplifier and cause occurrence of peak detection error.

SUMMARY

The primary object of the present invention is to cancel offset voltage by two choppers in operational amplifier circuit of peak detector so that the peak detection influenced by offset voltage can be prevented.

A peak detector of the present invention includes an operational amplifier circuit, a charge transistor and a charge capacitor. The operational amplifier circuit includes a first chopper, a transconductance amplifier, a second chopper and a low pass filter. The transconductance amplifier is electrically connected with the first and second choppers, and the low pass filter is electrically connected with the second chopper. The second chopper is configured to modulate an offset voltage of the transconductance amplifier to higher frequency. The low pass filter is configured to filter out the offset voltage with higher frequency. The charge transistor is electrically connected with the low pass filter of the operational amplifier circuit, and turning on or off the charge transistor is determined by an output signal of the low pass filter. The charge capacitor is electrically connected with the charge transistor and the operational amplifier circuit, and when the charge transistor is turned on, the charge capacitor is charged for detecting a peak of an input voltage signal.

An operational amplifier circuit of a peak detector includes a first chopper, a transconductance amplifier, a second chopper and a low pass filter. The transconductance amplifier is electrically connected with the first and second choppers. The first chopper is configured to receive and modulate an input voltage signal and a charge voltage signal to higher frequency. The transconductance amplifier is configured to modulate the input voltage signal and the charge voltage signal with higher frequency to a first output signal and a second output signal with higher frequency. The second chopper is configured to modulate the first output signal and the second output signal to lower frequency and modulate an offset voltage of the transconductance amplifier to higher frequency. The low pass filter, which is electrically connected with the second chopper, is configured to filter out the offset voltage with higher frequency and remain the first output signal and the second output signal with lower frequency.

The modulation of the first and second choppers and the filtering of the low pass filter can cancel the offset voltage of the transconductance amplifier, such that the detection of the peak detector will not be affected by the offset voltage and the accuracy of the peak detector will be improved.

DETAILED DESCRIPTION OF THE INVENTION

Figure 1:
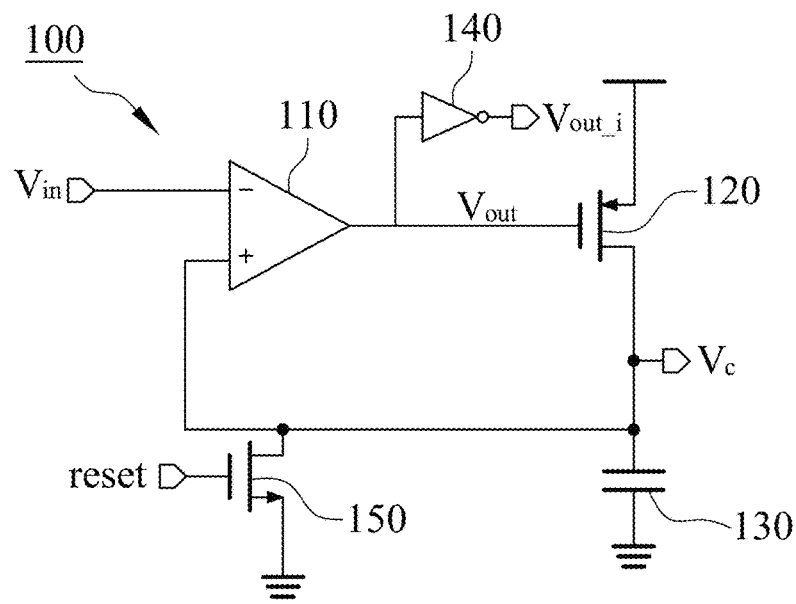
FIG. 1 is a circuit diagram illustrating a peak detector in accordance with one embodiment of the present invention.

A circuit diagram of a peak detector 100 in one embodiment is represented in FIG. 1. The peak detector 100 includes an operational amplifier (OPA) circuit 110, a charge transistor 120, a charge capacitor 130, an inverter 140 and a reset transistor 150. The OPA circuit 110 is arranged to receive an input voltage signal $V_{in}$ via a negative end and output a output signal $V_{out}$ via a output end. The charge transistor 120 is arranged to receive the output signal $V_{out}$ by a gate terminal and receive a power by a source terminal. As a result, turning on or turning off the charge transistor 120 can be determined by the electric potential of the output signal $V_{out}$. One end of the charge capacitor 130 is electrically connected with a drain terminal of the charge transistor 120, and the other end of the charge capacitor 130 is connected to ground. When the transistor 120 is ON, the power can charge the charge capacitor 130 through the charge transistor 120 to increase the electric potential of a charge voltage signal $V_c$ of the charge capacitor 130, then the charge voltage signal $V_c$ of the charge capacitor 130 feedbacks to a positive end of the OPA circuit 110 for comparing the charge voltage signal $V_c$ and the input voltage signal $V_{in}$ in electric potential. Owing to the charge voltage signal $V_c$ and the input voltage signal $V_{in}$ are respectively inputted into the positive end and the negative end of the OPA circuit 110, when the input voltage signal $V_{in}$ is higher than the charge voltage signal $V_c$ in electric potential, the output voltage signal $V_{out}$ is low potential and switches on the charge transistor 120 to charge the charge capacitor 130 by the power. On the contrary, when the input voltage signal $V_{in}$ is lower than the charge voltage signal $V_c$ in electric potential, the output signal $V_{out}$ is high potential and cut off the charge transistor 120, so the power stops charging the charge capacitor 130 and that means the input voltage signal $V_{in}$ reaches a peak.

With reference to FIG. 1, the inverter 140 is electrically connected with the output end of the OPA circuit 110 for receiving the output signal $V_{out}$, and the inverter 140 is configured to invert the output signal $V_{out}$ to an invert output signal $V_{out\_i}$ for the benefit of back-end circuit control. However, the inverter 140 is not essential in the present invention, i.e., the peak detector 100 in other embodiments may not require the inverter 140.

With reference to FIG. 1, a drain terminal of the reset transistor 150 is electrically connected with one end of the charge capacitor 130, a gate terminal of the reset transistor 150 is arranged to receive a reset signal reset and a source terminal of the reset transistor 150 is connected to ground. When the reset signal reset is high potential, the reset transistor 150 is turned on and provides a discharge path for the charge capacitor 130, so can lower the electric potential of the charge voltage signal $V_c$ and reset the peak detector 100 for the next peak detection.

Figure 2:
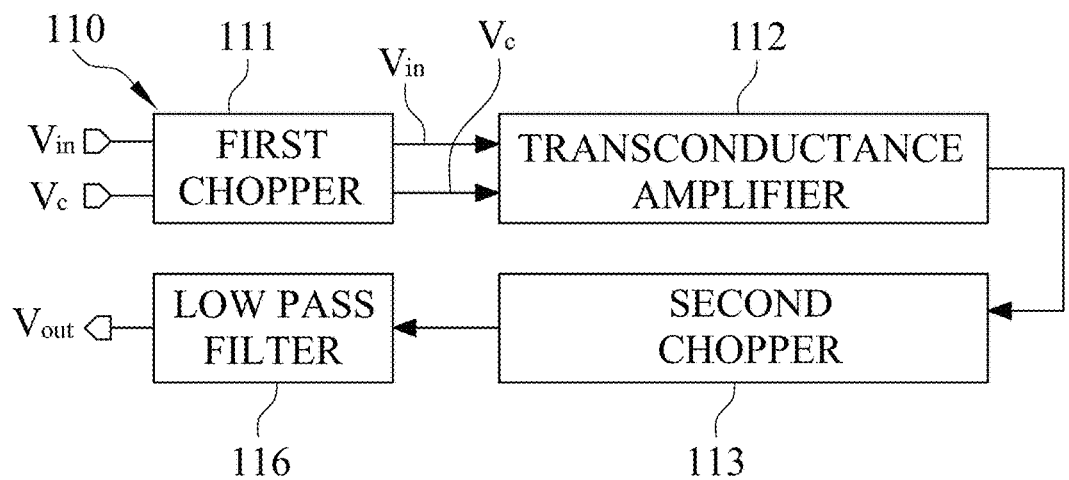
FIG. 2 is a functional block diagram illustrating an operational amplifier circuit of the peak detector in accordance with one embodiment of the present invention.

FIG. 2 is a functional block diagram of the OPA circuit 110. The OPA circuit 110 includes a first chopper 111, a transconductance amplifier 112, a second chopper 113 and a low pass filter 116. An offset voltage in the transconductance amplifier 112 is the major problem affecting the peak detector 100 accuracy. For this reason, the first and second choppers 111 and 113 are provided to eliminate the interference of the offset voltage in the transconductance amplifier 112.

The first chopper 111 is configured to receive and up-modulate the input voltage signal $V_{in}$ and the charge voltage signal $V_c$ to higher frequency. The transconductance amplifier 112 is electrically connected with the first chopper 111 and is configured to convert the input voltage signal $V_{in}$ and the charge voltage signal $V_c$ with higher frequency into a output signal with higher frequency. The second chopper 113 is electrically connected with the transconductance amplifier 112 and is utilized to down-modulate the output signal to lower frequency. However, because the first chopper 111 didn't modulate the offset voltage of the transconductance amplifier 112, the offset voltage delivered to the second chopper 113 will be up-modulated to higher frequency by the second chopper 113. The low pass filter 116 is electrically connected with the second chopper 113 and is configured to filter out the offset voltage of the transconductance amplifier 112, which is up-modulated to higher frequency; and output the output signal $V_{out}$ with lower frequency, so can eliminate the influence of the offset voltage of the transconductance amplifier 112.

Figure 3:
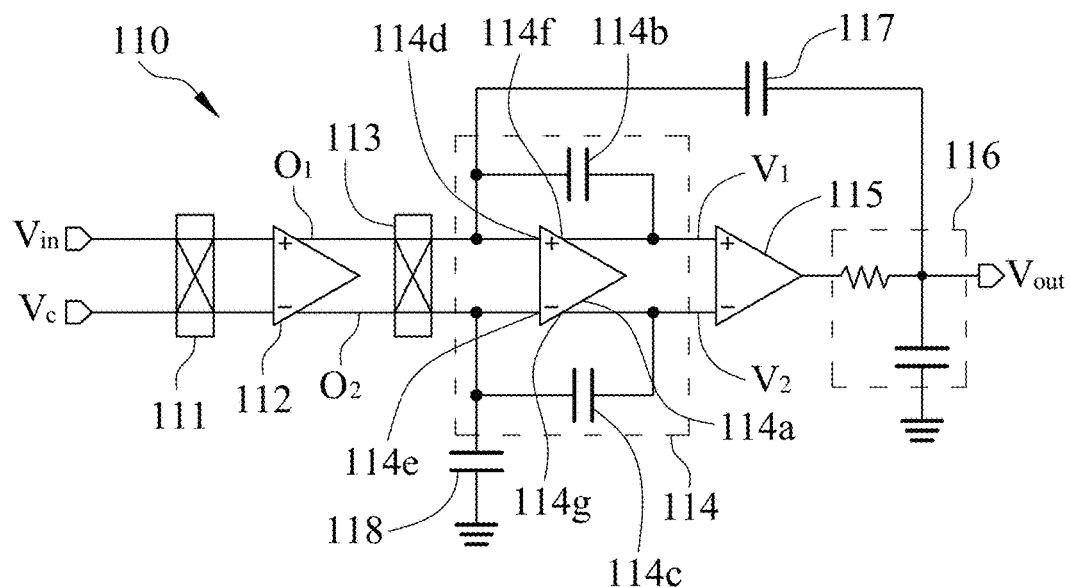
FIG. 3 is a circuit diagram illustrating the operational amplifier circuit of the peak detector in accordance with one embodiment of the present invention.

With reference to FIG. 3, it is a circuit diagram showing the OPA circuit 110 in a better embodiment of the present invention. The OPA circuit 110 further includes an integrator 114 and a buffer 115 in this embodiment, and the transconductance amplifier 112 has a double-ended output.

Figure 4:
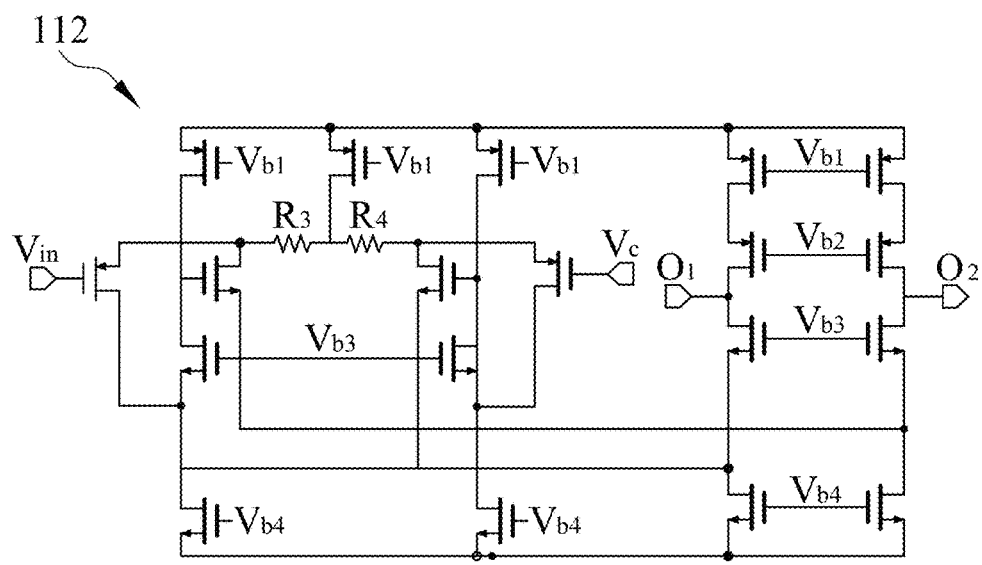
FIG. 4 is a circuit diagram illustrating a transconductance amplifier of the operational amplifier circuit in accordance with one embodiment of the present invention.

In this embodiment, similarly, the first chopper 111 is configured to receive and up-modulate the input voltage signal $V_{in}$ and the charge voltage signal $V_c$ to higher frequency, and the transconductance amplifier 112 is configured to receive the input voltage signal $V_{in}$ and the charge voltage signal $V_c$ with higher frequency and output a first output signal $O_1$ and a second output signal $O_2$. The transconductance amplifier 112 in this embodiment is an operational transconductance amplifier whose circuit is shown as FIG. 4, and the operational transconductance amplifier is used to convert voltage signals into current signals. The symbols $V_{b1}$~$V_{b4}$ in FIG. 4 are the bias voltages.

With reference to FIG. 3, the second chopper 113 is configured to receive and down-modulate the first output signal $O_1$ and the second output signal $O_2$ to lower frequency. Furthermore, the second chopper 113 is configured to up-modulate the offset voltage of the transconductance amplifier 112 to higher frequency due to the first chopper 111 didn't up-modulate the offset voltage to higher frequency.

The integrator 114 is electrically connected with the second chopper 113 and is provided to receive the first output signal $O_1$, the second output signal $O_2$ and the offset voltage which are modulated by the second chopper 113. Moreover, the integrator 114 is used to provide a gain and convert the first output signal $O_1$ and the second output signal $O_2$ with lower frequency to a first voltage signal $V_1$ and a second voltage signal $V_2$, and is used to filter out the partial offset voltage which is up-modulated to high frequency. The buffer 115 is electrically connected with the integrator 114 for receiving the first and second voltage signals $V_1$ and $V_2$. And the buffer 115 is configured to separate the integrator 114 and the low pass filter 116 for preventing the interaction with each other and convert from double-ended output to signal-ended output for the benefit of back-end circuit use. The low pass filter 116 is electrically connected with the buffer 115 in order to filter out the offset voltage with higher frequency in the output signals, such that to obtain the output signal $V_{out}$ without the influence of the offset voltage.

Figure 5:
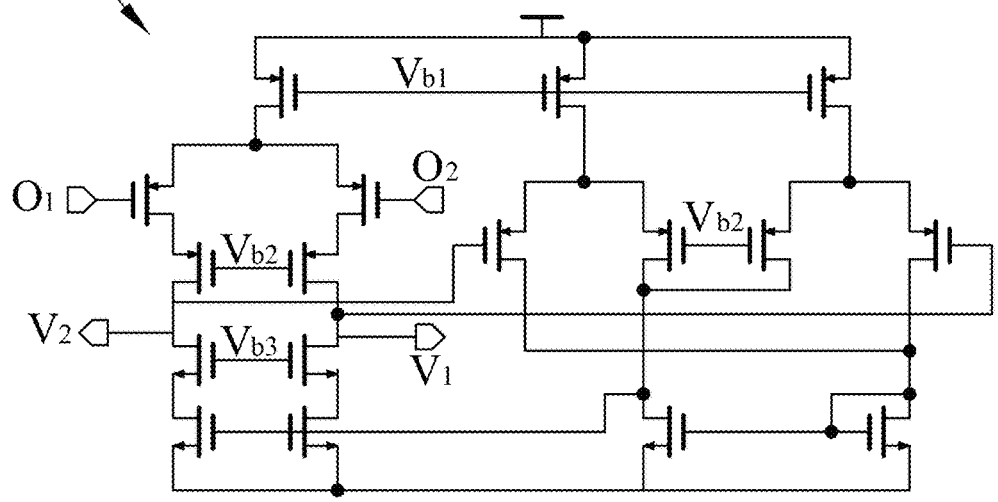
FIG. 5 is a circuit diagram illustrating an integrated operational amplifier of the operational amplifier circuit in accordance with one embodiment of the present invention.

With reference to FIG. 3, the integrator 114 includes an integrated operational amplifier 114a, a first integrated capacitor 114b and a second integrated capacitor 114c in this embodiment. The integrated operational amplifier 114a includes a positive input end 114d, a negative input end 114e, a first output end 114f and a second output end 114g. The positive and negative input ends 114d and 114e are electrically connected with the second chopper 113 for receiving the first output signal $O_1$ and the second output signal $O_2$, respectively. Two ends of the first integrated capacitor 114b are respectively and electrically connected with the positive input end 114d and the first output end 114f. And two ends of the second integrated capacitor 114c are respectively and electrically connected with the negative input end 114e and the second output end 114g. The circuit diagram of the integrated operational amplifier 114a is shown as FIG. 5, and the symbols $V_{b1}$~$V_{b3}$ in FIG. 5 are the bias voltages.

Figure 6:
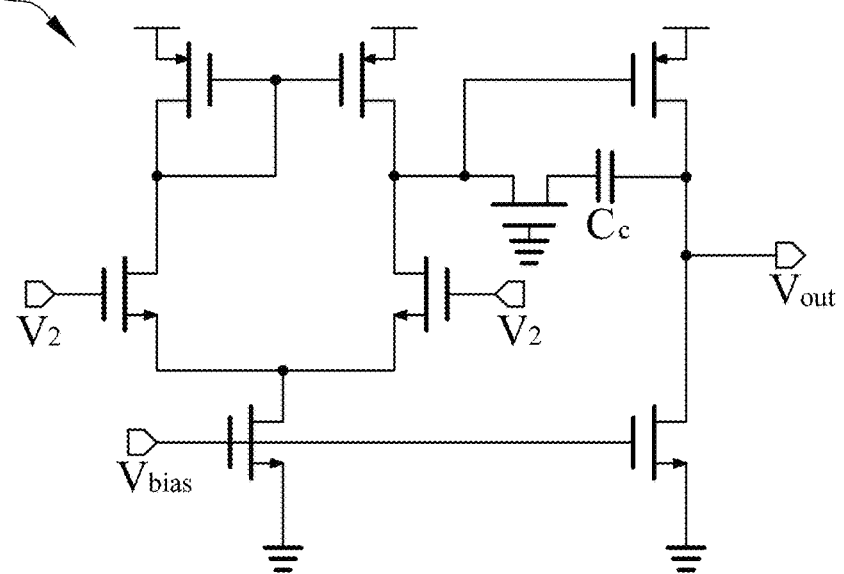
FIG. 6 is a circuit diagram illustrating a buffer of the operational amplifier circuit in accordance with one embodiment of the present invention.

FIG. 6 is the circuit diagram of the buffer 115, and the symbol $V_{bias}$ is the bias voltage. The capacitor Cc is a Miller compensation capacitor which is used to increase the phase margin and allow the buffer 115 to operate normally when existing a feedback path. As a result, the occurrence of signal oscillation and signal divergence is preventable.

With reference to FIG. 3, the OPA circuit 110 in this embodiment further includes a first frequency compensation capacitor 117 and a second frequency compensation capacitor 118 which are used for frequency compensation. Two ends of the first frequency compensation capacitor 117 are respectively and electrically connected with the positive input end 114d of the integrated operational amplifier 114a and the low pass filter 116. One end of the second frequency compensation capacitor 118 is electrically connected with the negative input end 114e of the integrated operational amplifier 114a, and the other end of the second frequency capacitor 118 is connected to ground.

The modulation of the first and second choppers 111 and 113 and the filtering of the low pass filter 116 can cancel the offset voltage of the transconductance amplifier 112, such that the detection of the peak detector 100 will not be affected by the offset voltage and the accuracy of the peak detector 100 will be improved.

While this invention has been particularly illustrated and described in detail with respect to the preferred embodiments thereof, it will be clearly understood by those skilled in the art that is not limited to the specific features shown and described, and various modified and changed in form and details may be made without departing from the spirit and scope of this invention.

What is claimed is:

1. A peak detector comprising:
an operational amplifier circuit including a first chopper, a transconductance amplifier, a second chopper and a low pass filter, the transconductance amplifier is electrically connected with the first and second choppers, and the low pass filter is electrically connected with the second chopper, wherein the second chopper is configured to modulate a offset voltage of the transconductance amplifier to higher frequency, and the low pass filter is configured to filter out the offset voltage with higher frequency;
a charge transistor electrically connected with the low pass filter of the operational amplifier circuit, wherein turning on or turning off the charge transistor is determined by a output signal of the low pass filter; and
a charge capacitor electrically connected with the charge transistor and the operational amplifier circuit, wherein when the charge transistor is turned on, the charge capacitor is charged for detecting a peak of a input voltage signal.

2. The peak detector in accordance with claim 1, wherein the first chopper is configured to receive and modulate the input voltage signal and a charge voltage signal of the charge capacitor to higher frequency, the transconductance amplifier is configured to convert the input voltage signal the charge voltage signal with higher frequency to a first output signal and a second output signal with higher frequency, and the second chopper is configured to modulate the first output signal and the second output signal from higher frequency to lower frequency.

3. The peak detector in accordance with claim 2 further includes an integrator, wherein the integrator is electrically connected with the second chopper, and the integrator is configured to provide a gain and convert the first output signal and the second output signal to a first voltage signal and a second voltage signal.

4. The peak detector in accordance with claim 3, wherein the integrator includes an integrated operational amplifier, a first integrated capacitor and a second integrated capacitor, the integrated operational amplifier includes a positive input end, a negative input end, a first output end and a second output end, wherein two ends of the first integrated capacitor are respectively and electrically connected with the positive input end and the first output end, and two ends of the second integrated capacitor are respectively and electrically connected with the negative input end and the second output end.

5. The peak detector in accordance with claim 3 further includes a buffer, wherein the buffer is electrically connected with the integrator for receiving the first voltage signal and the second voltage signal, and the buffer is configured to separate the integrator and the low pass filter.

6. The peak detector in accordance with claim 1 further includes an inverter, wherein the inverter is electrically connected with the low pass filter of the operational amplifier circuit for receiving the output signal, and the inverter is configured to output an invert output signal.

7. A operational amplifier circuit of a peak detector comprising:
a first chopper configured to receive and modulate a input voltage signal and a charge voltage signal to higher frequency;
a transconductance amplifier electrically connected with the first chopper, wherein the transconductance amplifier is configured to modulate the input voltage signal and the charge voltage signal with higher frequency to a first output signal and a second output signal with higher frequency;
a second chopper electrically connected with the transconductance amplifier, wherein the second chopper is configured to modulate the first output signal and the second output signal from higher frequency to lower frequency, and the second chopper is configured to modulate a offset voltage of the transconductance amplifier to higher frequency; and
a low pass filter electrically connected with the second chopper, wherein the low pass filter is configured to filter out the offset voltage with higher frequency and remain the first output signal and the second output signal with lower frequency.

8. The operational amplifier circuit in accordance with claim 7 further includes an integrator, wherein the integrator is electrically connected with the second chopper, and the integrator is configured to provide a gain and convert the first output signal and the second output signal to a first voltage signal and a second voltage signal.

9. The operational amplifier circuit in accordance with claim 8, wherein the integrator includes an integrated operational amplifier, a first integrated capacitor and a second integrated capacitor, the integrated operational amplifier includes a positive input end, a negative input end, a first output end and a second output end, and wherein two ends of the first integrated capacitor are respectively and electrically connected with the positive input end and the first output end, and two ends of the second integrated capacitor are respectively and electrically connected with the negative input end and the second output end.

10. The operational amplifier circuit in accordance with claim 8 further includes a buffer, wherein the buffer is electrically connected with the integrator for receiving the first voltage signal and the second voltage signal, and the buffer is configured to separate the integrator and the low pass filter.

* * * * *